United States Patent
Kim

(10) Patent No.: US 6,952,886 B1
(45) Date of Patent: Oct. 11, 2005

(54) OVERLAY VERNIER

(75) Inventor: Nam Min Kim, Sarawak (MY)

(73) Assignee: 1st Silicon (Malaysia) SDN BHD, Sawawak (MY)

( * ) Notice: Subject to any disclaimer, the term of this patent is extended or adjusted under 35 U.S.C. 154(b) by 0 days.

(21) Appl. No.: 10/703,590

(22) Filed: Nov. 10, 2003

(51) Int. Cl.[7] .............................................. G01B 11/00
(52) U.S. Cl. ............................ 33/645; 33/613; 414/935
(58) Field of Search ....................... 33/613, 645, 533, 33/297–298; 414/935–941

(56) References Cited

U.S. PATENT DOCUMENTS 6,357,131 B1 * 3/2002 Cheng et al. ................. 33/645
6,536,130 B1 * 3/2003 Wu et al. ...................... 33/645
6,571,485 B1 * 6/2003 Yu et al. ....................... 33/645
2003/0101610 A1 * 6/2003 Yu et al. ....................... 33/645

* cited by examiner

*Primary Examiner*—Diego Gutierrez
*Assistant Examiner*—Yaritza Guadalupe
(74) *Attorney, Agent, or Firm*—Lawrence Y.D. Ho & Associates

(57) ABSTRACT

The present invention provides a new and improved overlay vernier that can increase the overlay measurement accuracy. The overlay vernier of the present invention comprises an inner square vernier and an outer square vernier. The outer vernier comprises a central square opening and four trapezoid-shaped openings surrounding the central square opening.

5 Claims, 2 Drawing Sheets

OVERLAY VERNIER

FIELD OF THE INVENTION

The present invention relates in general to overlay verniers for measuring lithography overlay accuracy.

BACKGROUND OF THE INVENTION

Typically in the fabrication of semiconductor devices, a plurality of patterned layers are successively formed into a stack on a semiconductor substrate. Photolithography is conventionally used to produce various patterned layers. In photolithography, it is critical that the successive, patterned layers are accurately aligned relative to each other. Presently, it is conventional to use overlay verniers of the box-in-box type to measure the overlay or placement error of the patterns. These overlay verniers are typically formed at the scribe lines on the semiconductor wafer being processed.

FIG. 1 shows the top plan view of a conventional overlay vernier having an inner vernier 2 formed at an upper level and an outer vernier 1 formed at a lower level in a semiconductor device being fabricated. The outer vernier 1 contains four slits 3a, 3b, 3c, 3d, which define a square. The slits 3a, 3b, 3c, 3d are conventionally filled with a suitable insulative or conductive material. The inner vernier 2 is smaller in size than the outer vernier 1 and is positioned over the center of the outer vernier 1 as shown in FIG. 1. The overlay accuracy between the patterned layers is measured by comparing the distances a, b, c, d between the inner vernier 2 and the slits 3a, 3b, 3c, 3d. The outer vernier 1 is typically large in size, thus, it is affected easily by thermal processing and chemical-mechanical polishing during device fabrication. Thermal processing, e.g., baking at a high temperature, may cause the outer vernier 1 to be deformed due to expansion or shrinkage. This deformation results in overlay measurement error.

SUMMARY OF THE INVENTION

The present invention provides a new and improved overlay vernier that can increase the overlay measurement accuracy. The overlay vernier of the present invention comprises an inner square vernier and an outer square vernier. The outer vernier comprises a central square opening and four trapezoid-shaped openings surrounding the central square opening.

BRIEF DESCRIPTION OF THE DRAWINGS

The novel features and advantages of the present invention will become apparent from the following description of the preferred embodiment of the invention when considered in conjunction with the accompanying drawings.

DETAILED DESCRIPTION OF THE PREFERRED EMBODIMENT

Figure 1:
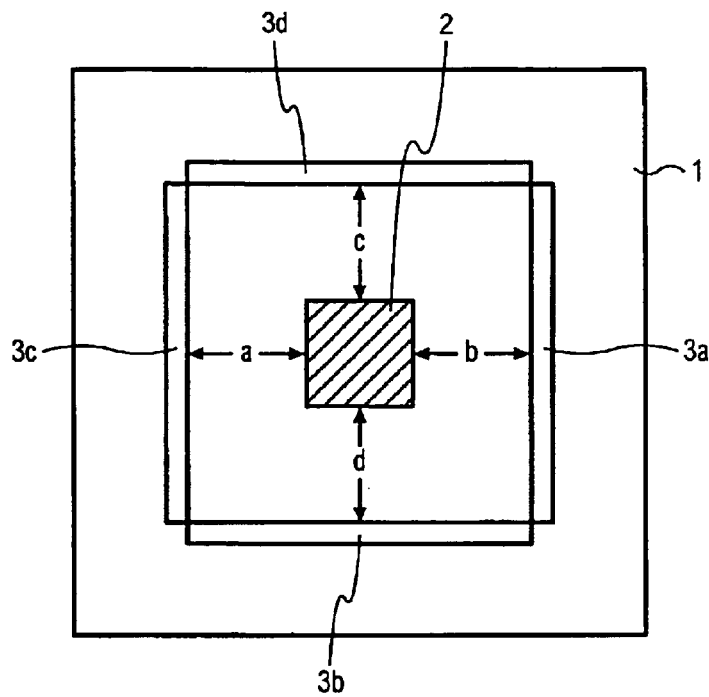
FIG. 1 illustrates the top plan view of a conventional overlay vernier.
Figure 2:
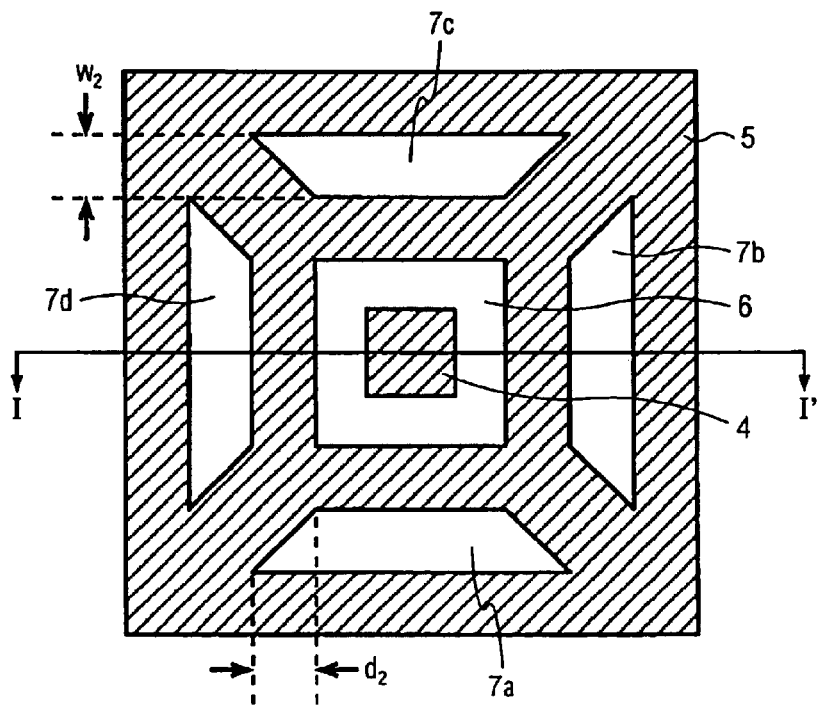
FIG. 2 illustrates the top plan view of an overlay vernier in according to the preferred embodiment of the present invention.

FIG. 2 shows the top plan view of the overlay vernier in according to the preferred embodiment of the present invention. The overlay vernier comprises an inner square vernier 4 and an outer vernier 5. The outer vernier 5 comprises a central square opening 6 and four trapezoid openings 7a, 7b, 7c, 7d arranged around the square opening 6 as shown in FIG. 2. It is preferred that each trapezoid opening has two substantially parallel sides and two non-parallel sides. The width $w_2$ of each of the trapezoid openings is preferably about 5 μm. The spacing $d_2$ between the central square opening 6 and each trapezoid opening is preferably about 5 μm.

Figure 3:
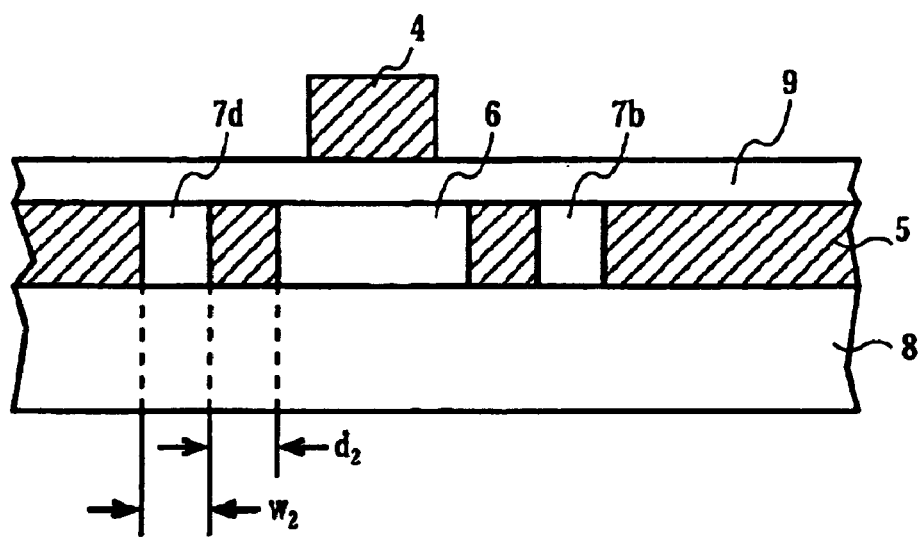
FIG. 3 illustrates the cross-sectional view along the cutting line I–I' shown in FIG. 2.

FIG. 3 shows the cross-sectional view of the overlay vernier shown in FIG. 2. The outer vernier 5 is formed on a substrate 8, and is made of a first material, for example, aluminum. The central opening 6 and the trapezoid openings 7a, 7b, 7c, and 7d are filled with a suitable second material, for example, a metal or a different insulative material. A layer 9 is formed on the outer vernier 5 so as to cover the upper surface of the outer vernier 5, and may be made of a suitable material such as tungsten. The inner square vernier 4 is formed on the layer 9 and is positioned above the central opening 6. The inner square vernier 4 may be made of a photoresist material.

The design of the outer vernier in according to the present invention reduces the deformation of the outer vernier during thermal treatments and chemical-mechanical polishing. As a result, the pattern-to-pattern overlay accuracy is improved.

While the preferred embodiment of the present invention has been described, it is to be understood that modifications will be apparent to those skilled in the art without departing from the spirit and scope of the invention as defined by the appended claims.

What is claimed is:

1. An overlay vernier for measuring overlay accuracy comprising:

an inner square vernier; and an outer vernier comprising a central square opening and four trapezoid openings arranged around the central opening;

wherein the outer vernier is formed on a lower level of a semiconductor device and the inner vernier is formed on an upper level of the device.

2. The overlay vernier according to claim 1, wherein the outer vernier is made of a first material and the central square opening and the trapezoid openings are filled with a second material.

3. The overlay vernier according to claim 2, wherein each trapezoid opening has a length and a width, and the trapezoid openings are arranged so that the length of each trapezoid opening is substantially parallel to a side of the central square opening.

4. The overlay vernier according to claim 3, wherein the width of each trapezoid opening is of about 5 μm.

5. The overlay vernier according to claim 3, wherein the spacing between the central opening and each trapezoid opening is about 5 μm.

* * * * *